(12) United States Patent
Sakamoto

(10) Patent No.: US 11,980,012 B2
(45) Date of Patent: May 7, 2024

(54) POWER CONVERSION DEVICE

(71) Applicant: DENSO CORPORATION, Kariya (JP)

(72) Inventor: Kazuki Sakamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/991,906

(22) Filed: Nov. 22, 2022

(65) Prior Publication Data

US 2023/0084775 A1    Mar. 16, 2023

Related U.S. Application Data

(63) Continuation of application No. PCT/JP2021/019468, filed on May 21, 2021.

(30) Foreign Application Priority Data

Jun. 15, 2020    (JP) .................................. 2020-103162

(51) Int. Cl.
```
G06F 1/16      (2006.01)
H05K 5/00      (2006.01)
H05K 7/00      (2006.01)
H05K 7/14      (2006.01)
H05K 7/20      (2006.01)
```

(52) U.S. Cl.
CPC ....... H05K 7/20936 (2013.01); H05K 7/1428 (2013.01); H05K 7/1432 (2013.01)

(58) Field of Classification Search
CPC ............ H05K 7/20936; H05K 7/1428; H05K 7/1432; H05K 7/2089; H05K 7/20909; H05K 7/20918; H05K 7/1427; H05K 7/1422; H05K 7/14322; H05K 7/14324; H05K 7/14325; H05K 7/14327
See application file for complete search history.

(56) References Cited

U.S. PATENT DOCUMENTS

| | | | | |
|---|---|---|---|---|
| 9,184,670 B2* | 11/2015 | Matsuno | ............... | H02M 7/003 |
| 9,241,429 B2* | 1/2016 | Kaneko | ................... | H01L 24/36 |
| 9,247,675 B2* | 1/2016 | Higuchi | .................. | B60L 50/51 |
| 9,633,926 B2* | 4/2017 | Takano | .................... | H01L 23/40 |
| 9,693,489 B2* | 6/2017 | Park | .................... | F28D 1/05333 |
| 9,742,305 B2* | 8/2017 | Takabayashi | ......... | H02M 7/003 |
| 9,807,913 B2* | 10/2017 | Matsumoto | ........... | H01L 23/427 |

(Continued)

FOREIGN PATENT DOCUMENTS

| | | |
|---|---|---|
| JP | 6406179 B2 | 10/2018 |
| JP | 2019-97237 A | 6/2019 |

*Primary Examiner* — Anthony M Haughton
(74) *Attorney, Agent, or Firm* — Oliff PLC

(57) ABSTRACT

A power conversion device includes a cooler, a terminal block and a case. The cooler defines an internal space through which a refrigerant flows. The terminal block covers a conducive part. The case accommodates the cooler and the terminal block therein. The case has an opening on its lateral wall portion for allowing connection between the conductive part of the terminal block inside the case and an external load disposed outside the case. At least a part of the terminal block is located closer to the opening than the cooler in a first direction to which an inner surface and an outer surface of the lateral wall portion of the case defining the opening are opposed, and is located between the cooler and an upper end of the opening in a second direction orthogonal to the first direction.

4 Claims, 7 Drawing Sheets

(56) References Cited

U.S. PATENT DOCUMENTS

| | | | |
|---|---|---|---|
| 10,080,314 B2* | 9/2018 | You | H05K 1/18 |
| 2014/0185266 A1* | 7/2014 | Iwata | H05K 7/1432 |
| | | | 361/820 |
| 2014/0198450 A1* | 7/2014 | Baba | H05K 9/0007 |
| | | | 361/689 |
| 2014/0284765 A1* | 9/2014 | Kiuchi | H02M 7/537 |
| | | | 257/532 |
| 2015/0222195 A1* | 8/2015 | Tachibana | H02M 7/003 |
| | | | 361/699 |
| 2017/0141082 A1 | 5/2017 | Hirasawa et al. | |
| 2019/0174647 A1 | 6/2019 | Umeda et al. | |

\* cited by examiner

POWER CONVERSION DEVICE

CROSS REFERENCE TO RELATED APPLICATIONS

The present application is a continuation application of International Patent Application No. PCT/JP2021/019468 filed on May 21, 2021, which designated the U.S. and claims the benefit of priority from Japanese Patent Application No. 2020-103162 filed on Jun. 15, 2020. The entire disclosures of all of the above applications are incorporated herein by reference.

TECHNICAL FIELD

The present disclosure relates to a power conversion device having a terminal block.

BACKGROUND

There is a power conversion device having a cooler through which a refrigerant flows and a case accommodating the cooler therein.

SUMMARY

The present disclosure describes a power conversion device which is capable of suppressing a refrigerant from flowing out of a case, even if the refrigerant leaks from a cooler accommodated in the case. According to an aspect of the present disclosure, a power conversion device includes a cooler defining an internal space to allow a refrigerant to flow therein; a terminal block covering a conducive part; and a case accommodating the cooler and the terminal block therein. The case has an opening on its lateral wall portion for allowing connection between the conductive part of the terminal block inside the case and an external load disposed outside the case. At least a part of the terminal block is located closer to the opening than the cooler in a first direction to which an inner surface and an outer surface of the lateral wall portion of the case defining the opening are opposed, and is located between the cooler and an upper end of the opening in a second direction orthogonal to the first direction.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
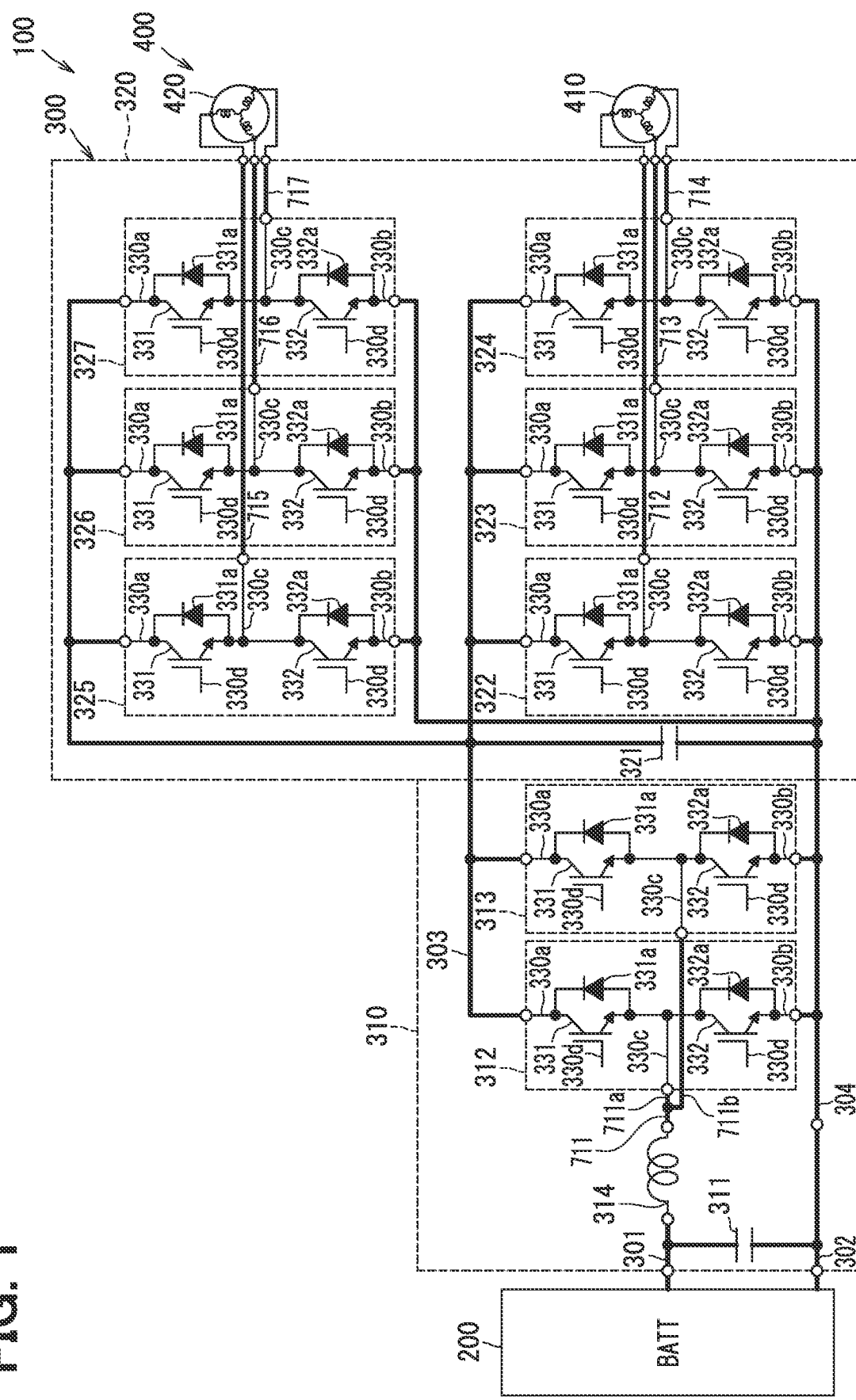
FIG. 1 is a circuit diagram of an in-vehicle system including a power conversion device according to a first embodiment.

To begin with, a relevant technology will be described only for understanding the embodiments of the present disclosure.

For example, there is known a power conversion device that has a cooler through which a refrigerant flows and a case accommodating the cooler therein. The case has an alternating current (AC) connector connection part defining an opening on a lateral wall portion for allowing an AC connector to be electrically connected to an AC load to pass through. If the refrigerant leaks from an internal space of the cooler, the refrigerant may flow toward the AC connector connection part. Further, the refrigerant may leak out of the case from the opening of the AC connector connection part.

The present disclosure provides a power conversion device, which is capable of suppressing a refrigerant from flowing out of a case, even if the refrigerant leaks out from a cooler disposed in the case.

According to an aspect of the present disclosure, a power conversion device includes: a cooler, a terminal block, and a case. The cooler has an internal space through which a refrigerant flows. The terminal block covers a conductive part. The case has a bottom portion and a lateral wall portion extending from the bottom portion, and defines a storage space with the bottom portion and the lateral wall portion. The cooler and the terminal block are disposed in the storage space of the case. The lateral wall portion is formed with an opening passing through the lateral wall portion from an inner surface of the lateral wall portion facing the storage space to an outer surface of the lateral wall portion opposite to the inner surface in a first direction. The opening is provided to allow connection between the conductive part of the terminal block accommodated in the storage space and an external load disposed outside of the storage space. At least a part of the terminal block is located closer to the opening than the cooler in the first direction, and is located between an upper end of the opening, which is a furthest portion of the opening from the bottom portion, and the cooler in a second direction orthogonal to the first direction.

According to such a configuration, even if the refrigerant leaks out from the internal space of the cooler, the terminal block is likely to block a flow of the refrigerant from the cooler toward the opening. As a result, leakage of the refrigerant from the opening to the outside of the case can be easily suppressed.

The following will describe embodiments for carrying out the present disclosure with reference to the drawings. In each of the embodiments, components corresponding to the matter described in a preceding embodiment(s) may be given the same reference numerals in a subsequent embodiment(s), and description thereof will not be repeated. Where only some components of a configuration are described in the subsequent embodiment, corresponding parts of the preceding embodiment may be applied to the other components of the configuration.

In addition, not only the combination between portions explicitly described that the combination is possible in each embodiment, but also partial combinations between the embodiments, between the embodiment and the modification, and between the modifications can be made if there is no problem in the combination in particular even when not explicitly described.

First Embodiment

<In-Vehicle System>

First, an in-vehicle system 100 to which a power conversion device 300 of the present embodiment will be applied will be described with reference to FIG. 1. The in-vehicle system 100 constitutes a hybrid system.

The in-vehicle system 100 includes a battery 200, the power conversion device 300, and a motor 400. The in-vehicle system 100 further has an engine (not shown) and a power distribution mechanism (not shown). The power conversion device 300 includes a sensor unit 700. The motor 400 includes a first motor generator (MG) 410 and a second motor generator (MG) 420. The motor 400 corresponds to an external load. In FIG. 1, the battery 200 is abbreviated and indicated as "BATT". The sensor unit 700 will be explained later in detail.

The in-vehicle system 100 further includes a plurality of electronic control units (ECUs), though not shown. The plural ECUs transmit and receive signals to and from each other via a bus wiring. The plural ECUs cooperate with each other so as to control a hybrid electric vehicle. By the cooperative control of the plural ECUs, power running and power generation (regeneration) of the motor 400 according to a state of charge (SOC) of the battery 200, an output of the engine, and the like are controlled.

The battery 200 includes a plurality of secondary batteries. The plural secondary batteries form a battery stack connected in series. Examples of the secondary battery include a lithium ion secondary battery, a nickel hydrogen secondary battery, an organic radical battery and the like.

The SOC of the battery 200 corresponds to the SOC of the battery stack described above. The SOC of the battery stack is the sum of the SOCs of the plural secondary batteries. Overcharging and overdischarging of the SOC of the battery stack are avoided by the cooperative control of the ECUs described above. On the other hand, overcharging and overdischarging of the SOC of each of the plural secondary batteries are avoided by an equalization process for equalizing the SOC of each of the plural secondary batteries.

The power conversion device 300 performs power conversion between the battery 200 and the first MG 410. The power conversion device 300 further performs power conversion between the battery 200 and the second MG 420. The power conversion device 300 converts a direct current (DC) power of the battery 200 into an AC power at a voltage level suitable for power running of the first MG 410 and the second MG 420. The power conversion device 300 converts the AC power generated by power generation of the first MG 410 and the second MG 420 into a DC power at a voltage level suitable for charging the battery 200. The power conversion device 300 will be described later in detail.

The first MG 410, the second MG 420, and the engine are each connected to the power distribution mechanism. The first MG 410 generates electric power by a rotational energy supplied from the engine. The AC power generated by this power generation is converted into a DC power and is stepped down by the power conversion device 300. This DC power is supplied to the battery 200. The DC power is also supplied to various electric loads mounted on a hybrid electric vehicle.

The second MG 420 is connected to an output shaft of the hybrid electric vehicle. The rotational energy of the second MG 420 is transmitted to traveling wheels via the output shaft. On the contrary, the rotational energy of the traveling wheels is transmitted to the second MG 420 via the output shaft.

The second MG 420 is electrically driven by the AC power supplied from the power conversion device 300. The rotational energy generated by this electric driving is distributed to the engine and the traveling wheels by the power distribution mechanism. In this way, cranking of the crankshaft is performed, and a propulsive force is applied to the traveling wheels. Further, the second MG 420 is regenerated by a rotational energy transmitted from the traveling wheels. The AC power generated by this regeneration is converted into the DC power and is stepped down by the power conversion device 300. This DC power is supplied to the battery 200 and various electric loads.

<Circuit Configuration of Power Conversion Device>

Next, circuit configurations of the power conversion device 300 will be described. As shown in FIG. 1, the power conversion device 300 includes a converter 310 and an inverter 320 as components of a power conversion circuit. The converter 310 functions to raise or lower a voltage level of DC power. The inverter 320 functions to transform a DC power into an AC power. The inverter 320 functions to transform the AC power into the DC power.

The converter 310 steps up the DC power of the battery 200 to a voltage level suitable for torque generation of the first MG 410 and the second MG 420. The inverter 320 then converts the DC power into the AC power. The AC power is then supplied to the first MG 410 and the second MG 420. Further, the inverter 320 converts the AC power generated by the first MG 410 and the second MG 420 into the DC power. The converter 310 steps down the DC power to a voltage level suitable for charging the battery 200.

As shown in FIG. 1, the converter 310 is electrically connected to the battery 200 via a first bus bar 301 and a second bus bar 302. The converter 310 is electrically connected to the inverter 320 via a third bus bar 303 and a fourth bus bar 304.

<Converter>

The converter 310 has a first capacitor 311, an A-phase switch module 312, a B-phase switch module 313, and a reactor 314 as electrical elements.

As shown in FIG. 1, one end of the first bus bar 301 is connected to a positive electrode of the battery 200. One end of the second bus bar 302 is connected to a negative electrode of the battery 200. One of the two electrodes of the first capacitor 311 is connected to the first bus bar 301. The other of the two electrodes of the first capacitor 311 is connected to the second bus bar 302.

One end of the reactor 314 is connected to the other end of the first bus bar 301. Further, as shown in FIG. 1, the other end of the reactor 314 is connected to one end of a first connection bus bar 711. The first connection bus bar 711 is branched into a first connection portion 711a and a second connection portion 711b on the other end side. The other end of the reactor 314 is connected to the A-phase switch module 312 via the first connection portion 711a. The other end of the reactor 314 is connected to the B-phase switch module 313 via the second connection portion 711b.

Thus, the positive electrode of the battery 200 and the A-phase switch module 312 are electrically connected via the reactor 314 and the first connection bus bar 711. The positive electrode of the battery 200 and the B-phase switch module 313 are electrically connected via the reactor 314 and the first connection bus bar 711.

Further, as shown in FIG. 1, the A-phase switch module 312 and the B-phase switch module 313 are connected in parallel between the third bus bar 303 and the fourth bus bar 304. One end of the fourth bus bar 304 is electrically and mechanically connected to the other end of the second bus bar 302. Note that, in FIG. 1, connection portions of various bus bars are shown with the white circle. These connection portions are electrically connected by, for example, bolts or welding.

The A-phase switch module 312 and the B-phase switch module 313 each have a high-side switch 331 and a low-side switch 332. Also, the A-phase switch module 312 and the B-phase switch module 313 each have a high-side diode 331a and a low-side diode 332a. These semiconductor elements are covered with and protected by a sealing resin 330.

In the present embodiment, the high-side switch 331 and the low-side switch 332 each employs an n-channel type insulated gate bipolar transistor (IGBT). Ends of respective terminals connected to collector electrodes, emitter electrodes, and gate electrodes of the high-side switch 331 and the low-side switch 332 are exposed to the outside of the sealing resin 330.

As shown in FIG. 1, the emitter electrode of the high-side switch 331 and the collector electrode of the low-side switch 332 are connected to each other. The high-side switch 331 and the low-side switch 332 are thus connected in series.

Further, a cathode electrode of the high-side diode 331a is connected to the collector electrode of the high-side switch 331. An anode electrode of the high-side diode 331a is connected to the emitter electrode of the high-side switch 331. The high-side diode 331a is thus connected in anti-parallel to the high-side switch 331.

Similarly, a cathode electrode of the low-side diode 332a is connected to the collector electrode of the low-side switch 332. An anode electrode of the low-side diode 332a is connected to the emitter electrode of the low-side switch 332. The low-side diode 332a is thus connected in anti-parallel to the low-side switch 332.

As described above, the high-side switch 331 and the low-side switch 332 are covered with and protected by the sealing resin 330. Ends of terminals, which are respectively connected to the collector electrode and the gate electrode of the high-side switch 331, an intermediate point between the high-side switch 331 and the low-side switch 332, and the emitter electrode and the gate electrode of the low-side switch 332, are exposed from the sealing resin 330. In the following, these terminals are referred to as a collector terminal 330a, an intermediate point terminal 330c, an emitter terminal 330b, and a gate terminal 330d.

The collector terminal 330a is connected to the third bus bar 303. The emitter terminal 330b is connected to the fourth bus bar 304. As such, the high-side switch 331 and the low-side switch 332 are serially connected in order from the third bus bar 303 to the fourth bus bar 304.

Also, the intermediate point terminal 330c of the A-phase switch module 312 is connected to the first connection portion 711a of the first connection bus bar 711. The intermediate point terminal 330c of the B-phase switch module 313 is connected to the second connection portion 711b of the first connection bus bar 711.

As described above, the DC power from the battery 200 is supplied to the intermediate point of the two switches of the A-phase switch module 312 via the first bus bar 301, the reactor 314, and the first connection bus bar 711. The DC power from the battery 200 is supplied to the intermediate point of the two switches of the B-phase switch module 313 via the first bus bar 301, the reactor 314, and the second connection bus bar 712.

The AC power of the motor 400 is converted into the DC power by the inverter 320, and is then supplied to the collector electrodes of the high-side switches 331 of the A-phase switch module 312 and the B-phase switch module 313. This DC power, which has been converted from the AC power of the motor 400, is supplied to the battery 200 via the high-side switch 331, the first connection bus bar 711, the reactor 314, and the first bus bar 301. In this way, the first connection bus bar 711 allows the DC power inputted to or outputted from the battery 200 to flow.

The gate terminal 330d of each of the high-side switch 331 and the low-side switch 332 is connected to a gate driver. The motor generator ECU (hereinafter, MG-ECU) generates a control signal and outputs the control signal to the gate driver. The gate driver amplifies the control signal and outputs the amplified control signal to the gate terminal 330d. Thus, the high-side switch 331 and the low-side switch 332 are controlled to open and close by the MG-ECU. As a result, the voltage level of the DC power input to the converter 310 is stepped up and down.

The MG-ECU generates a pulse signal as the control signal. The MG-ECU adjusts a step-up level and a step-down level of the DC power by adjusting an on-duty ratio and a frequency of the pulse signal. The step-up level and the step-down level are determined according to the target torque of the motor 400 and the SOC of the battery 200.

When stepping up the DC power of the battery 200, the MG-ECU alternately opens and closes the high-side switch 331 and the low-side switch 332. On the contrary, when steeping down the DC power supplied from the inverter 320, the MG-ECU fixes the control signal output to the low-side switch 332 to a low level. At the same time, the MG-ECU sequentially switches the control signal output to the high-side switch 331 between a high level and a low level.

<Inverter>

The inverter 320 has, as electrical elements, a second capacitor 321, a first U-phase switch module 322, a first V-phase switch module 323, a first W-phase switch module 324, a second U-phase switch module 325, a second V-phase switch module 326 and a second W-phase switch module 327.

One of two electrodes of the second capacitor 321 is connected to the third bus bar 303. The other of the two electrodes of the second capacitor 321 is connected to the fourth bus bar 304. The second capacitor 321 and the first U-phase switch module 322 through the second W-phase switch module 327 are connected in parallel with each other between the third bus bar 303 and the fourth bus bar 304.

Each of the first U-phase switch module 322 through the second W-phase switch module 327 has similar components to those of the A-phase switch module 312 and the B-phase switch module 313. That is, each of the first U-phase switch module 322 through the second W-phase switch module 327 has a high-side switch 331, a low-side switch 332, a high-side diode 331a, a low-side diode 332a, and a sealing resin 330. Further, each of the first U-phase switch module 322 through the second W-phase switch module 327 has a collector terminal 330a, an emitter terminal 330b, an intermediate point terminal 330c, and a gate terminal 330d.

The collector terminal 330a of each of the first U-phase switch module 322 through the second W-phase switch module 327 is connected to the third bus bar 303. The emitter terminal 330b of each of the first U-phase switch module 322 through the second W-phase switch module 327 is connected to the fourth bus bar 304.

The intermediate point terminal 330c of the first U-phase switch module 322 is connected to a first U-phase stator coil of the first MG 410 via a second connection bus bar 712. The intermediate point terminal 330c of the first V-phase switch module 323 is connected to a first V-phase stator coil of the first MG 410 via a third connection bus bar 713. The intermediate point terminal 330c of the first W-phase switch module 324 is connected to a first W-phase stator coil of the first MG 410 via a fourth connection bus bar 714.

Similarly, the intermediate point terminal 330c of the second U-phase switch module 325 is connected to a second U-phase stator coil of the second MG 420 via a fifth connection bus bar 715. The intermediate point terminal 330c of the second V-phase switch module 326 is connected to a second V-phase stator coil of the second MG 420 via a sixth connection bus bar 716. The intermediate point terminal 330c of the second W-phase switch module 327 is connected to a second W-phase stator coil of the second MG 420 via a seventh connection bus bar 717.

The gate terminal 330d of each of the first U-phase switch module 322 through the second W-phase switch module 327 is connected to the gate driver. When the first MG 410 and the second MG 420 are respectively in power running, the high-side switch 331 and the low-side switch 332 provided in each of the first U-phase switch module 322 through the second W-phase switch module 327 are controlled in a pulse width modulation manner by the output of the control signal from the MG-ECU. Accordingly, the three-phase alternating current is generated in the inverter 320.

When each of the first MG 410 and the second MG 420 generates power (regenerates), the MG-ECU, for example, stops the output of the control signal. At this time, the AC power generated by the power generation passes through the diode provided in each of the first U-phase switch module 322 through the second W-phase switch module 327. As a result, the AC power is transformed into DC power.

As described above, the AC power input to and output from the first MG 410 flows through the second to fourth connection bus bars 712 to 714, which connect the inverter 320 and the first MG 410. Likewise, the AC power input to and output from the second MG 420 flows through the fifth to seventh connection bus bars 715 to 717, which connect the inverter 320 and the second MG 420.

The types of the switch elements provided in each of the A-phase switch module 312, the B-phase switch module 313, and the first U-phase switch module 322 through the second W-phase switch module 327 are not particularly limited. For example, each of the switch element may employ a metal oxide semiconductor field effect transistor (MOSFET). Hereinafter, the A-phase switch module 312, the B-phase switch module 313, and the first U-phase switch module 322 through the second W-phase switch module 327 are collectively and generally referred to as switch modules 318 for a purpose of simplification of description.

The semiconductor elements such as the switches and the diodes included in these switch modules 318 may be formed of a semiconductor such as Si and may be formed of a wide-gap semiconductor such as SiC. The material of the semiconductors element is not particularly limited.

<Mechanical Configuration of Power Conversion Device>

Next, mechanical configurations of the power conversion device 300 will be described. For the description, three directions orthogonal to one another are referred to as an x-direction, a y-direction, and a z-direction. The x-direction corresponds to an alignment direction or a first direction. The z-direction corresponds to an orthogonal direction or a second direction orthogonal to the first direction. Note that, the term "direction" is omitted in the drawing.

In addition to the components of the power conversion circuit described so far, the power conversion device 300 includes a capacitor case 340, a reactor case 350, a cooler 500, the sensor unit 700, a substrate 800, a spring body 810, and a housing 900.

Each of the capacitor case 340 and the reactor case 350 is made of an insulating resin material. The capacitor case 340 accommodates the first capacitor 311 and the second capacitor 321 therein. The reactor case 350 accommodates the reactor 314 therein. It should be noted that the capacitor case 340 and the reactor case 350 may not be made of the resin material.

The cooler 500 includes a supply pipe 510, a discharge pipe 520 and a plurality of relay pipes 530. The supply pipe 510 and the discharge pipe 520 are connected through the plural relay pipes 530. Each of the supply pipe 510, the discharge pipe 520 and the relay pipes 530 forms an internal space inside thereof. Refrigerant is allowed to flow through the space inside of each of the supply pipe 510, the discharge pipe 520, and the plural relay pipes 530. The supply pipe 510 and the discharge pipe 520 correspond to refrigerant pipes.

Each of the supply pipe 510 and the discharge pipe 520 extends in the y-direction. The supply pipe 510 and the discharge pipe 520 are spaced apart from each other and arranged side by side in the x-direction. Each of the relay pipes 530 extends from the supply pipe 510 toward the discharge pipe 520 along the x-direction.

The supply pipe 510 and the discharge pipe 520 are welded to end portions 532 of each of the plural relay pipes 530, which are located at ends in the x-direction. Central portions 531 of the plural relay pipes 530 between the end portions 532 in the x-direction are spaced apart from each other and arranged side by side in the y-direction.

Figure 4:
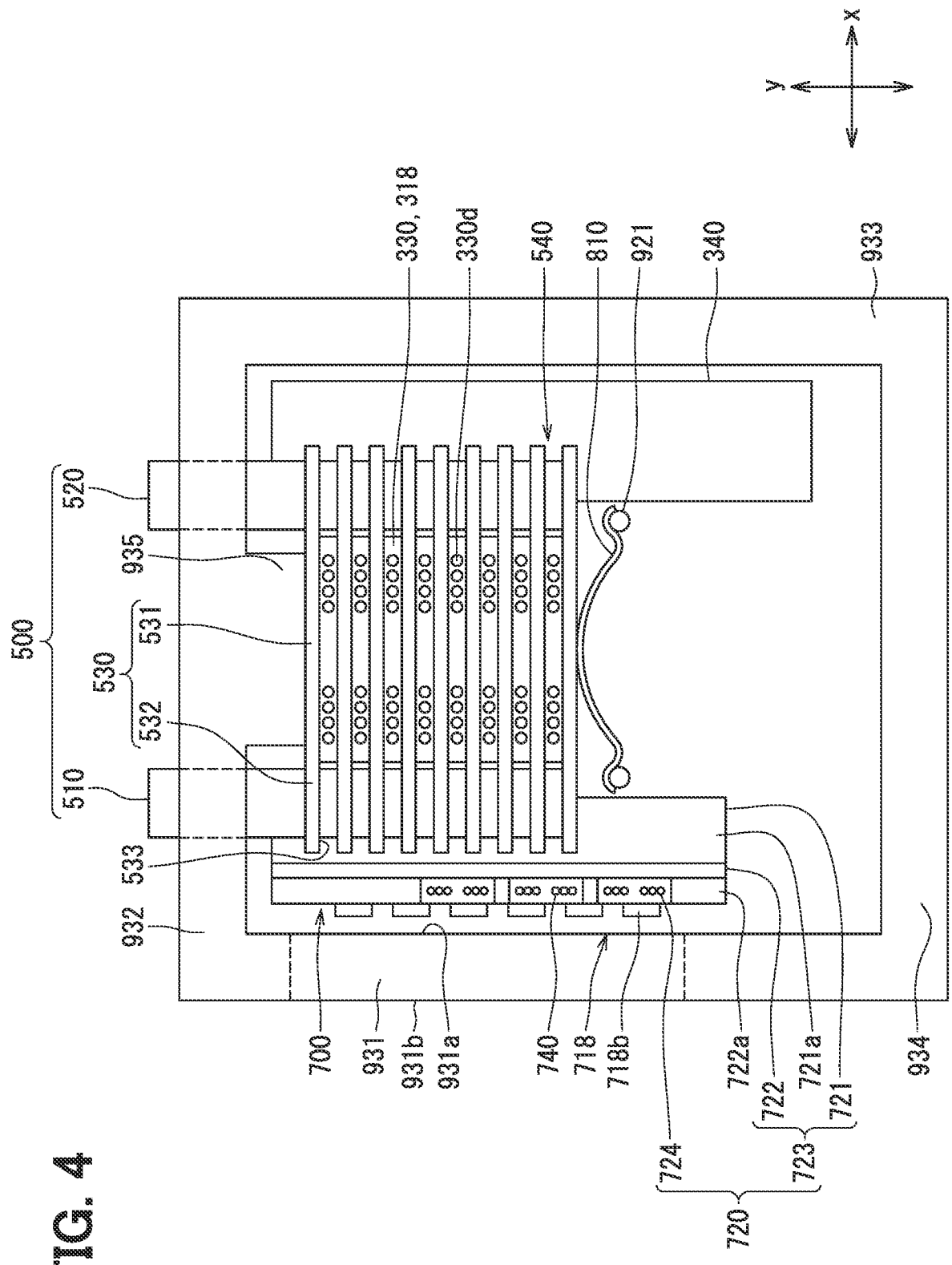
FIG. 4 is a top view of the power conversion device from which a cover and a substrate shown in FIG. 2 are removed.

As shown in FIG. 4, a gap is formed between the central portions 531 of two adjacent relay pipes 530. The cooler 500 has eight gaps in total between the adjacent central portions 531. The switch modules 318 of the A-phase, B-phase, first U-phase, first V-phase, first W-phase, second U-phase, second V-phase and second W-phase are individually arranged in the eight gaps. The cooler 500 has a function to cool the switch modules 318. The cooler 500 and the switch modules 318 accommodated in the cooler 500 constitute a power module 540.

In the present embodiment, the supply pipe 510 is located adjacent to a first wall portion 931, which will be described later, and the discharge pipe 520 is located adjacent to a third wall portion 933, which will be described later. However, the positions of the supply pipe 510 and the discharge pipe 520 may not be limited to the indicated example, but may be replaced.

The sensor unit 700 has a terminal block 720, a plurality of current sensors 730, a plurality of detection terminals 740, and the first to seventh connection bus bars 711 to 717. The terminal block 720 is provided by an insulating resin member or the like. The terminal block 720 covers a part of each of the first to seventh connection bus bars 711 to 717, the current sensors 730, and a part of each of the detection terminals 740. The first to seventh connection bus bars 711 to 717 correspond to conductive parts. Hereinafter, the first to seventh connection bus bars 711 to 717 are collectively and generally referred to as connection bus bars 718 as appropriate.

A portion of each of the plural connection bus bars 718 is enclosed in the terminal block 720, and an end of the remaining portion of each of the plural connection bus bars 718 is exposed from the terminal block 720. In FIGS. 2 to 7, the covered part of each of the plural connection bus bars 718 in the terminal block 720 is not illustrated.

One of the ends of each of the plural connection bus bars 718 is exposed from the terminal block 720 as a terminal connection portion 718a. The other of the ends of each of the plural connection bus bars 718 is exposed from the terminal block 720 as an external connection portion 718b. The terminal connection portions 718a are connected to the intermediate point terminals 330c of the eight-phase switch modules 318, respectively. The external connection portions 718b are connected to conductive connectors that are connected to the motor 400, the reactor 314, and the like.

The plural connection bus bars 718 are provided with the current sensors 730, respectively. The current sensor 730 detects a current flowing in the corresponding connection bus bar 718. Conductive detection terminal 740 are connected to the plural current sensors 730, respectively. A portion of each of the plural detection terminals 740 connected to the current sensor 730 is enclosed in the terminal block 720. Another portion of the detection terminal 740 opposite from the enclosed portion connected to the current sensor 730 is exposed from the terminal block 720.

The housing 900 includes a case 910 and a cover 960. The case 910 has a bottom portion 920, a lateral wall portion 930 and a first fastening portion 940. The bottom portion 920 has a flat shape with a thin thickness in the z-direction. The lateral wall portion 930 extends from an inner bottom surface 920a of the bottom portion 920 in the z-direction, and has a loop shape. The first fastening portion 940 is connected to the tip of the lateral wall portion 930 on the side away from, that is, opposite from the bottom portion 920. The first fastening portion 940 extends from the tip of the lateral wall portion 930 in a direction orthogonal to the z-direction. As a result, the case 910 has a storage space that is defined by the bottom portion 920 and the lateral wall portion 930 and forms an opening on the side of the first fastening portion 940, that is, on the side opposite to the bottom portion 920. Note that the bottom portion 920 and the lateral wall portion 930 are not always necessary to be integral, but may be provided by separate parts.

The lateral wall portion 930 has the first wall portion 931 and the third wall portion 933 spaced apart from and face each other in the x-direction. The lateral wall portion 930 further has a second wall portion 932 and a fourth wall portion 934 spaced apart from and face each other in the y-direction. The first wall portion 931, the second wall portion 932, the third wall portion 933, and the fourth wall portion 934 are connected to each other to form the loop shape around an axis along the z-direction.

The first wall portion 931, which is one of these four wall portions, is formed with a through hole 950 passing through the first wall portion 931 in the x-direction from an inner surface 931a facing the storage space and an outer surface 931b opposite to the storage space in the x-direction. A lower end 951 of the through hole 950, which is closest to the bottom portion 920 in the through hole 950, is positioned closer to the first fastening portion 940 than the bottom portion 920 in the z-direction. An upper end 952 of the through hole 950, which is the furthest portion in the through hole 950 from the bottom portion 920, is located closer to the bottom portion 920 than the first fastening portion 940 in the z-direction. The through hole 950 corresponds to an opening.

The cover 960 has an upper portion 970 that is thin in the z-direction, a peripheral wall portion 980, and a second fastening portion 990. The peripheral wall portion 980 extends from an upper inner surface 970a of the upper portion 970 in the z-direction, and has a loop shape. The second fastening portion 990 is connected to the tip of the peripheral wall portion 980 on the side away from the upper portion 970. The second fastening portion 990 extends from the tip of the peripheral wall portion 980 in directions orthogonal to the z-direction. Thus, the second fastening portion 990 has a loop shape.

The cover 960 is located adjacent to the opening of the case 910. The upper portion 970 is spaced apart from and faces the bottom portion 920 in the z-direction. The second fastening portion 990 faces and is in contact with the first fastening portion 940 in the z-direction. The second fastening portion 990 is mechanically connected to the first fastening portion 940 via bolts (not shown) or the like. Thus, the storage space of the case 910 is closed by the cover 960.

The capacitor case 340, the reactor case 350, the power module 540, the sensor unit 700, the substrate 800, the spring body 810, and the first to seventh connection bus bars 711 to 717 are accommodated in the storage space provided by the case 910 and the cover 960. The spring body 810 is a resilient member having a thin thickness in the y-direction.

<Accommodation Form>

Figure 2:
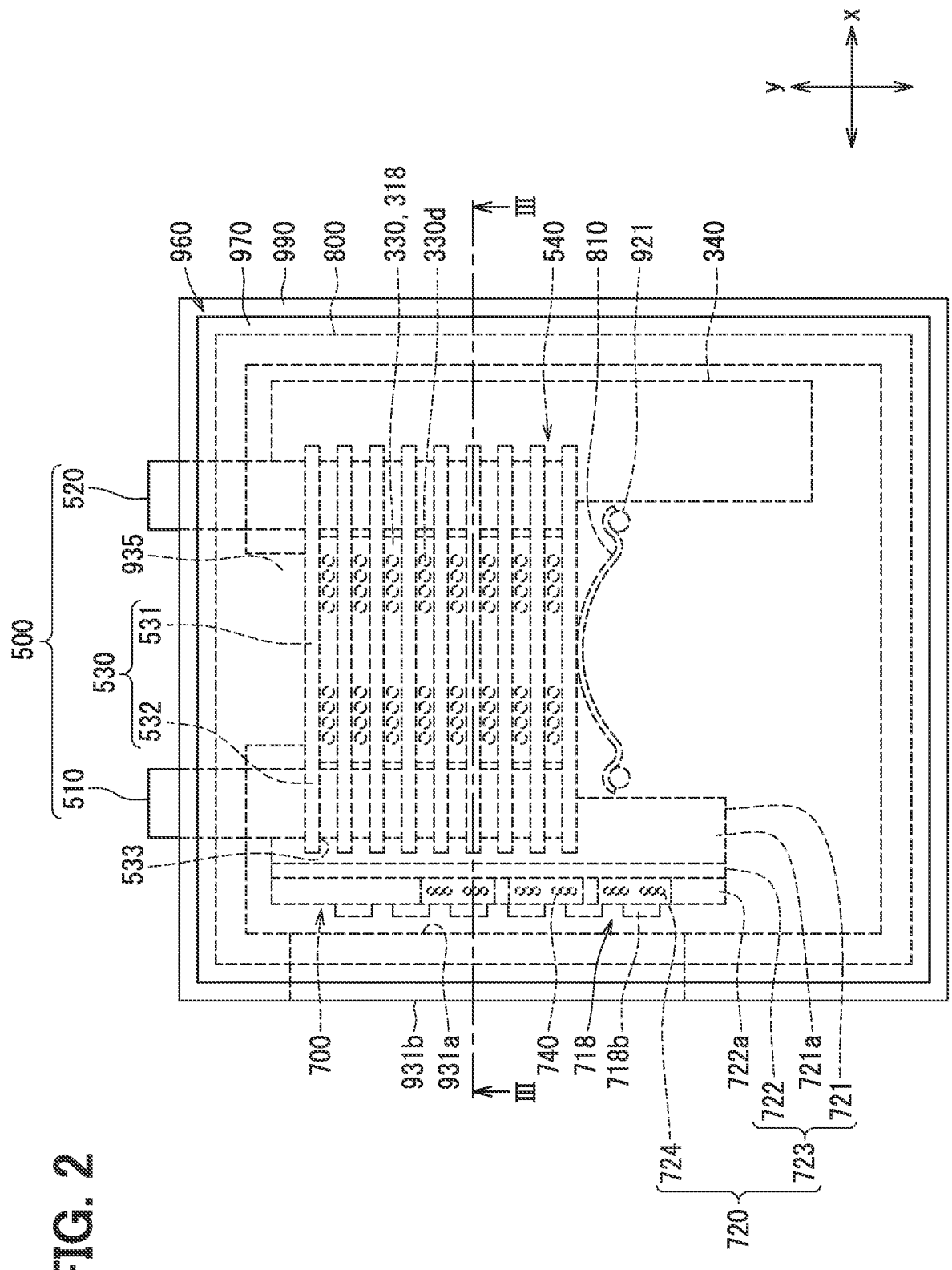
FIG. 2 is a top view of the power conversion device.
Figure 3:
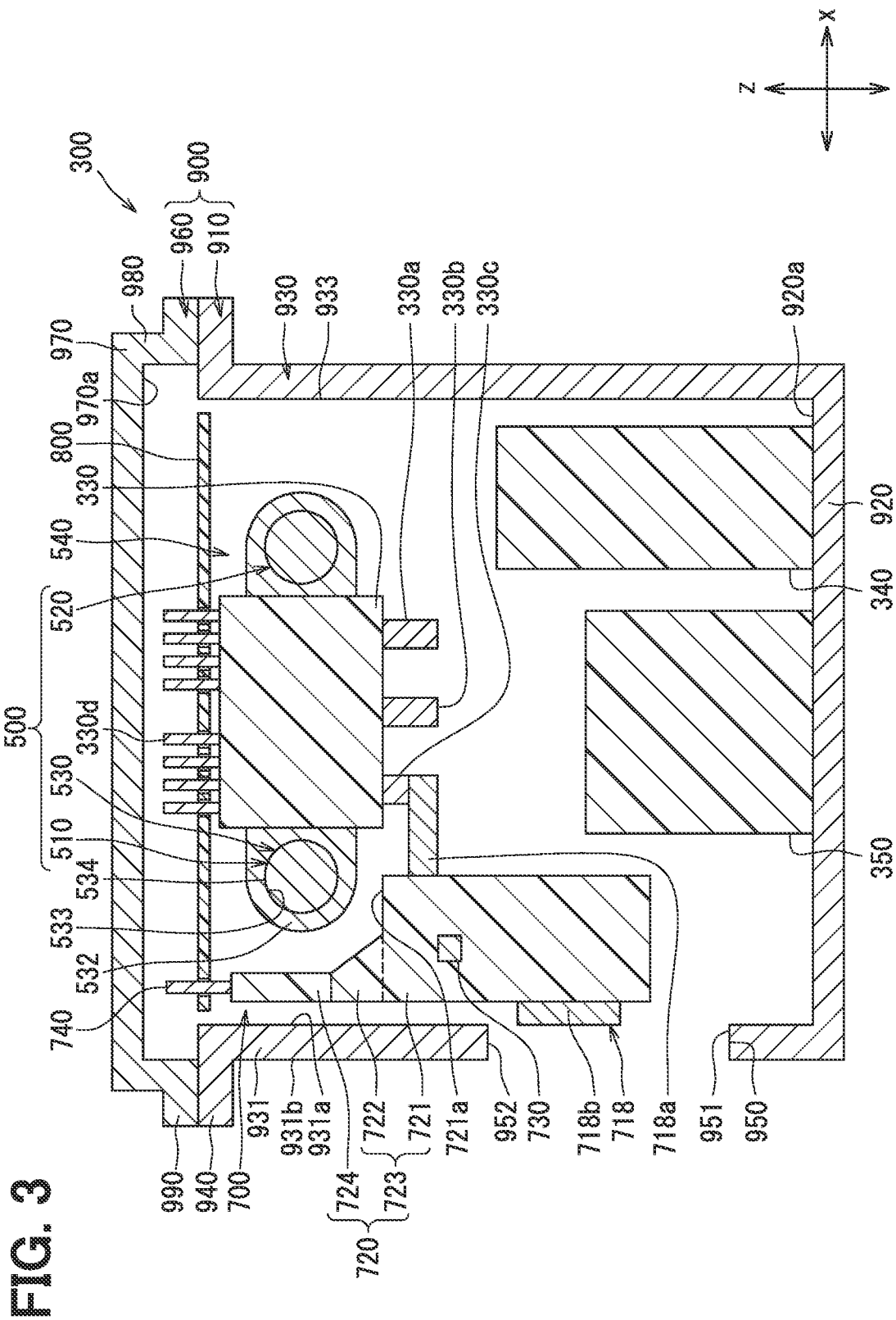
FIG. 3 is a cross-sectional view taken along a line III-III in FIG. 2.

An accommodation manner of each component in the housing 900 will be described below. As shown in FIGS. 2 to 4, the sensor unit 700 is located on the first wall portion 931 side in the x-direction. The capacitor case 340 is located on the third wall portion 933 side in the x-direction. The reactor case 350 is located between the sensor unit 700 and the capacitor case 340 in the x-direction.

The reactor case 350 is located on the bottom portion 920 side in the z-direction. The substrate 800 is located on the upper portion 970 side in the z-direction. The power module 540 is located between the reactor case 350 and the substrate 800 in the z-direction.

The power module 540 is spaced apart from the first wall portion 931 in the x-direction. A part of the terminal block 720 of the sensor unit 700 is located between the power module 540 and the first wall portion 931 in the x-direction.

Also, the power module 540 is located on the second wall portion 932 side in the y-direction. The spring body 810 is provided on the fourth wall portion 934 side of the power module 540.

The bottom portion 920 is provided with a plurality of holding portions 921 protruding in the z-direction. The plural holding portions 921 are located closer to the fourth wall portion 934 than the spring body 810 in the y-direction. The spring body 810 is disposed between the power module 540 and the plurality of holding portions 921. Note that the holding portions 921 may be integral with the bottom portion 920. Alternatively, the holding portions 921 may be provided by separate parts from the bottom portion 920.

The second wall portion 932 is formed with a protrusion 935 protruding from the second wall portion 932 toward the fourth wall portion 934. The spring body 810 applies a biasing force for biasing the power module 540 toward the protrusion 935. Thus, the power module 540 is pressed against the protrusion 935 by the biasing force.

As described so far, the switch modules 318 each sealed with the sealing resin 330 are individually accommodated between the two adjacent central portions 531 of the relay pipes 530. When the power module 540 is pressed against the protrusion 935, the contact area between the central portions 531 and the sealing resins 330 is increased. Therefore, heat generated from each of the switch modules 318 in eight phases can be actively dissipated to the refrigerant through the central portions 531.

As described so far, the tips of the collector terminal 330a, the emitter terminal 330b, the intermediate point terminal 330c, and the gate terminal 330d are exposed from the sealing resin 330. Among these four terminals, the collector terminal 330a, the emitter terminal 330b, and the intermediate point terminal 330c respectively extend in the z-direction toward the bottom portion 920.

The intermediate point terminals 330c are respectively connected to the first to seventh connection bus bars 711 to 717 by welding or the like. Although not shown, the collector terminal 330a is connected to the third bus bar 303 by welding or the like. Although not shown, the emitter terminal 330b is connected to the fourth bus bar 304 by welding or the like.

The gate terminal 330d extends in the z-direction toward the upper portion 970, that is, in the opposite direction to the collector terminal 330a, the emitter terminal 330b and the intermediate point terminal 330c. Further, the tip of the detection terminal 740 exposed from the terminal block 720 extends in the z direction toward the upper portion 970. The gate terminal 330d and the detection terminal 740 are respectively connected to the substrate 800, which is located adjacent to the upper portion 970, by soldering or the like.

The substrate 800 has a flat shape with a thin thickness in the z-direction. The substrate 800 has the gate driver and the MG-ECU mounted thereon. Also, the substrate 800 is formed with a plurality of through holes opening in the z direction. The tips of the gate terminal 330d and the detection terminals 740 extending toward the substrate 800 are inserted into the through holes of the substrate 800. The gate terminals 330d received in the through holes of the substrate 800 are connected to the gate driver. The detection terminals 740 received in the through holes of the substrate 800 are connected to the MG-ECU.

<Mechanical Configuration of Sensor Unit>

The terminal block 720 included in the sensor unit 700 has a first support portion 721, a second support portion 722, and a plurality of projecting portions 724.

The first support portion 721 has a substantially rectangular parallelepiped shape extending in the y-direction. The first support portion 721 covers the part of each of the plural connection bus bars 718 and the plural current sensors 730. The plural current sensors 730 are arranged to face the respective connection bus bars 718.

As shown in FIG. 3, the terminal connection portion 718a and the external connection portion 718b of each of the connection bus bars 718 are exposed from the first support portion 721. The terminal connection portion 718a extends from the first support portion 721 toward the third wall portion 933 in the x-direction. The terminal connection portion 718a is connected to the intermediate point terminal 330c of the corresponding switch module 318.

The external connection portion 718b is exposed from a portion of the first support portion 721 adjacent to the first wall portion 931. The external connection portion 718b is arranged to face the through hole 950 formed in the first wall portion 931 in the x-direction.

As shown in FIG. 4, the external connection portions 718b of the plural connection bus bars 718 are spaced apart from each other and arranged side by side in the y-direction. The plural external connection portions 718b are exposed to the outside of the housing 900 through the through hole 950. The conductive connectors and the like to be connected to the motor 400 are allowed to pass through the through hole 950. The plural external connection portions 718b are electrically and mechanically connected to the motor 400 via the conductive connectors and the like.

The second support portion 722 is connected to a first support surface 721a of the first support portion 721 on the upper portion 970 side. The second support portion 722 extends from the first support surface 721a toward the upper portion 970 in the z-direction. The dimension of the second support portion 722 in the x-direction decreases from the first support surface 721a toward its second support surface 722a adjacent to the upper portion 970. The surface of the second support portion 722 facing the third wall portion 933 has an upper end on the second support surface 722a side and a lower end on the first support surface 721a side. The surface of the second support portion 722 facing the third wall portion 933 is inclined, so that the upper end of the surface of the second support portion 722 is located closer to the first wall portion 931 than the lower end in the x-direction. The surface of the second support portion 722 facing the third wall portion 933 will also be referred to as an inclined facing surface.

The plural projecting portions 724 are connected to the second support surface 722a of the second support portion 722. The plural projecting portions 724 extend toward the upper portion 970 from the second support surface 722a. Each of the projecting portions 724 has a flat shape with a thin thickness in the x-direction. The plural projecting portions 724 are spaced apart from each other and arranged side by side in the y-direction. It should be noted that the shape of the plurality of projecting portions 724 need not be the flat shape with a thin thickness in the x-direction.

A part of the detection terminal 740 is enclosed in the projecting portion 724. The part of the detection terminal 740 is electrically connected to the current sensor 730. Further, a rest part of the detection terminal 740 is exposed from the projecting portion 724. The plural detection terminals 740 exposed from the respective projecting portions 724 extend toward the substrate 800 and are connected to the MG-ECU.

Note that the plural connection bus bars 718 may be covered in the second support portion 722. The current sensors 730 may be covered in the second support portion 722 or the projecting portions 724. A part of the detection terminal 740 may be covered in the first support portion 721 or the second support portion 722. In FIG. 3, a boundary between the first support portion 721 and the second support portion 722 is indicated by a dashed line. A boundary between the second support portion 722 and the projecting portion 724 is indicated by a dashed line. Hereinafter, the first support portion 721 and the second support portion 722 are collectively referred to as a support portion 723 as appropriate.

<Positional Relationship Between Sensor Unit and Peripheral Components>

As described so far, the part of the terminal block 720 included in the sensor unit 700 is positioned between the power module 540 and the first wall portion 931 in the x-direction. Specifically, a part of the support portion 723 on the first wall portion 931 side and the projecting portions 724 are located closer to the first wall portion 931 than the cooler 500 in the x-direction. Further, the part of the support portion 723 on the first wall portion 931 side is located between the upper end 952 of the through hole 950 and the cooler 500 in the z-direction.

As shown in FIG. 3, the projecting portion 724 is spaced apart from and faces the connection portions 533 between the supply pipe 510 and the relay pipes 530 of the cooler 500 in the x-direction. The connection portions 533 will be described later in detail. Further, the tip of the protruding portion 724 on the side away from the first support surface 721a in the z-direction is further away from the bottom portion 920 than the uppermost portions 534 of the connection portions 533 in the z-direction. The uppermost portion 534 of the connection portion 533 is the furthest portion in the connection portion 533 from the bottom portion 920, and thus will also be referred to as the furthest portion.

As shown in FIG. 4, some of the plural projecting portions 724 are arranged in a manner facing the supply pipe 510 and the relay pipes 530 in the x-direction. At least a part of the plural projecting portions 724 may be arranged facing the relay pipe 530 in the x-direction.

<Stress Generated in Cooler>

When the power module 540 is pressed against the protrusion 935, the central portions 531 of the relay pipes 530 deform toward the protrusion 935 in the y-direction. When the central portions 531 deform in the y-direction, the end portions 532 also deform in the y-direction.

However, there is a difference in the amount of deformation in the y-direction between the central portion 531 and the end portion 532. The amount of deformation in the y direction of the central portion 531 is greater than the amount of deformation in the y direction of the end portion 532. As a result, stress is likely to occur at the connection portion at which the end portion 532 of the relay pipe 530 is connected to the supply pipe 510 or the discharge pipe 520 such as by welding. In particular, the connection portion where the supply pipe 510 and the end portion 532 are connected by welding will be referred to as the connection portion 533 hereinafter.

<Operation and Advantageous Effects>

Figure 5:
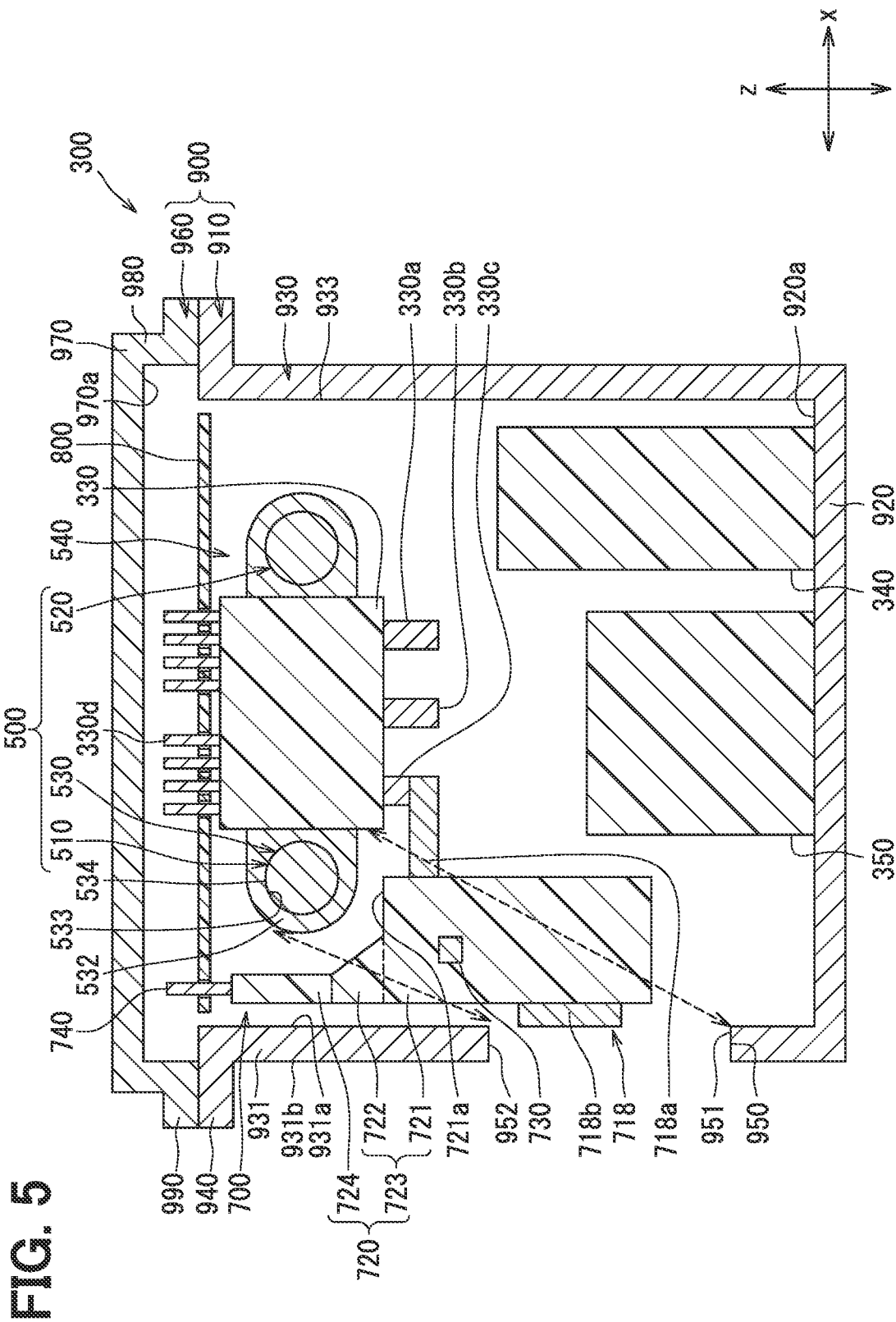
FIG. 5 is a cross-sectional view of the power conversion device for explaining effects.

The part of the support portion 723 on the first wall portion 931 side is positioned closer to the through hole 950 in the x direction than the cooler 500. The part of the support portion 723 on the first wall portion 931 side is located between the upper end 952 of the through hole 950 and the cooler 500 in the z-direction. Accordingly, as shown in FIG. 5, the part of the support portion 723 is interposed in such a manner as to partially cut through, that is, to pass through a region defined between the cooler 500 and the through hole 950.

Therefore, even if the refrigerant leaks from the cooler 500 and flows toward the through hole 950, the support portion 723 is likely to block and restrict the refrigerant from flowing from the cooler 500 toward the through hole 950. As a result, it is less likely that the refrigerant will leak outside the case 910 from the through hole 950.

As described so far, the surface of the second support portion 722 facing the third wall portion 933 has the upper end adjacent to the second support surface 722a and the lower end adjacent to the first support surface 721a. The upper end of the surface of the second support portion 722 facing the third wall portion 933 is located closer to the first wall portion 931 than the lower end in the x-direction.

As a result, even if the refrigerant leaks from the cooler 500, the surface of the second support portion 722 facing the third wall portion 933 facilitates the refrigerant to flow away from the through hole 950. The flow of refrigerant from the cooler 500 toward the through hole 950 is easily blocked.

As described so far, the projecting portions 724 face the connection portions 533 with a space therebetween in the x-direction.

As a result, even if the refrigerant leaks from the connection portion 533 and flows toward the through hole 950, the projecting portions 724 easily block the flow of the refrigerant toward the through hole 950.

In addition, the tip of the projecting portion 724 on the side away from the first support surface 721a is located further away from the bottom portion 920 than the uppermost portion 534 of the connection portion 533, which is on the furthest side from the bottom portion 920, in the z-direction.

As a result, even if the refrigerant leaks from the connection portion 533 and flows toward the upper portion 970, the projecting portion 724 is likely to block the flow of the refrigerant from the connection portion 533 toward the through hole 950.

Note that the effects described above are true not only when the refrigerant leaks from the connection portion 533 but also when the refrigerant leaks from the supply pipe 510 and flows toward the through hole 950.

As described so far, the lower end 951 of the through hole 950, which is the closest to the bottom portion 920 in the through hole 950 is separated from the bottom portion 920 in the z-direction.

As a result, even if the refrigerant leaks from the cooler 500 and flows toward the bottom portion 920, the portion of the first wall portion 931 that is present between the bottom portion 920 and the lower end 951 of the through hole 950 is likely to restrict the refrigerant from leaking from the through hole 950 to the outside of the case 910.

Although the present disclosure is described with reference to the exemplarily embodiment, the present disclosure is not limited to the above-described embodiment but may be implemented in various other ways without departing from the spirit of the present disclosure.

(First Modification)

Figure 6:
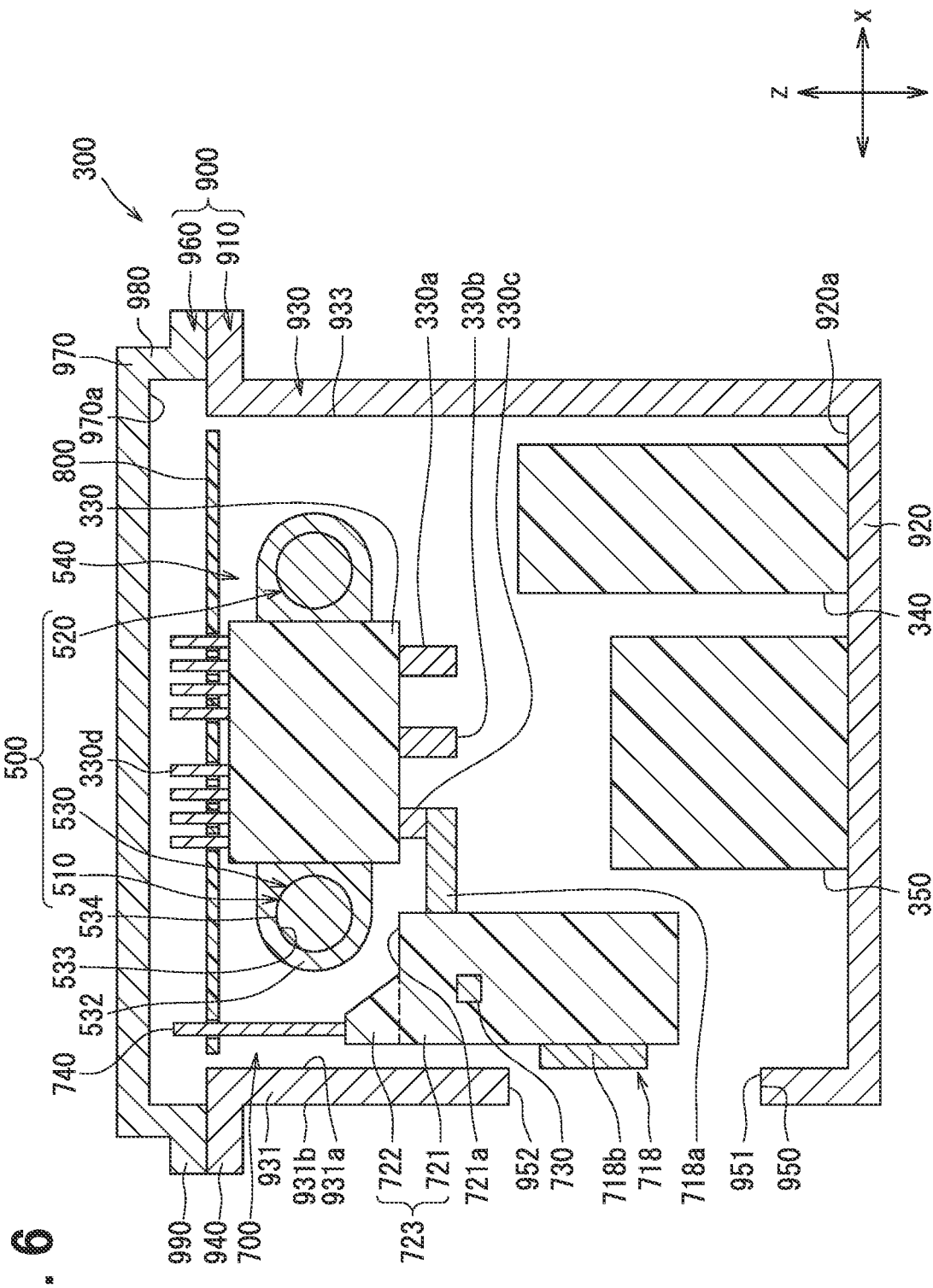
FIG. 6 is a cross-sectional view of a power conversion device as a modification.

As shown in FIG. 6, the terminal block 720 may not have the projecting portions 724. In such a case, the part of the support portion 723 on the first wall portion 931 side may be positioned between the upper end 952 of the through hole 950 and the cooler 500 in the z-direction. A part of the detection terminal 740 is enclosed in the support portion 723 and the rest part of the detection terminal 740 is exposed from the support portion 723. A part of the support portion 723 located adjacent to the first wall portion 931 between the upper end 952 of the through hole 950 and the cooler 500 is likely to block the flow of the refrigerant from the cooler 500 toward the through hole 950.

(Second Modification)

Figure 7:
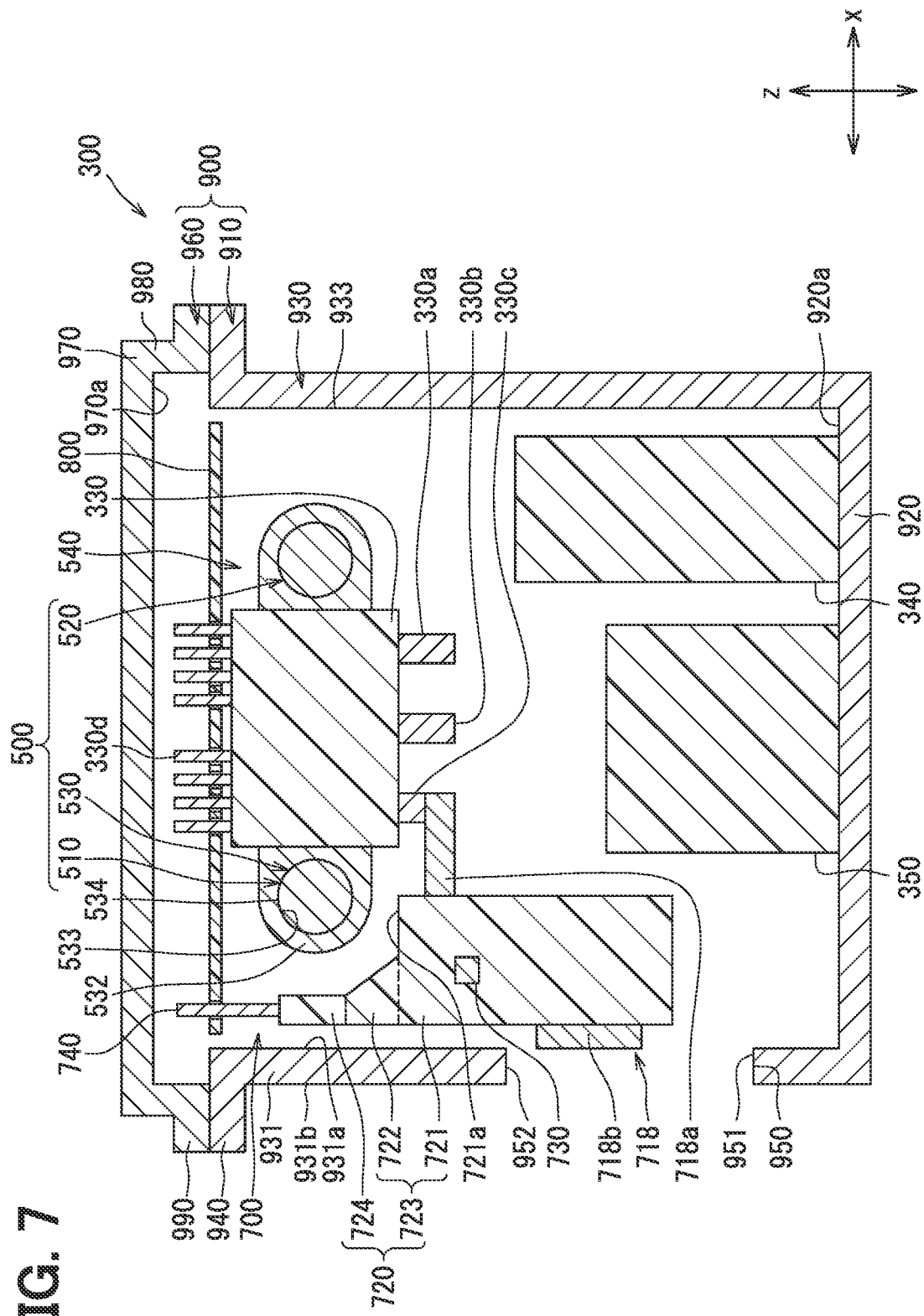
FIG. 7 is a cross-sectional view of a power conversion device as another modification.

As shown in FIG. 7, the tip of the projecting portion 724 on the side opposite from the first support surface 721a in the z-direction may not be further away from the bottom portion 920 than the uppermost portion 534 of the connection portion 533. The projecting portion 724 may face the connection portion 533 in the x direction. The protruding portion 724 is likely to block the refrigerant from flowing from the connection portion 533 toward the through hole 950.

(Other Modifications)

The embodiment and modifications described above each indicate the example in which the power conversion device 300 including the sensor unit 700 is applied to the in-vehicle system 100 constituting the hybrid system. However, the application of the power conversion device 300 is not particularly limited to the example described above. For example, the power conversion device 300 may be adopted to an in-vehicle system 100 of a battery electric vehicle.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A power conversion device comprising:
a cooler defining an internal space therein to allow a refrigerant to flow;
a terminal block covering a conductive part; and
a case having a bottom portion and a lateral wall portion extending from the bottom portion, the bottom portion and the lateral wall portion defining a storage space of the case, and the case accommodating the cooler and the terminal block in the storage space, wherein
the lateral wall portion is formed with an opening passing through the lateral wall portion from an inner surface facing the storage space to an outer surface opposite to the inner surface in a first direction for allowing connection between the conductive part accommodated in the storage space and an external load disposed outside of the storage space,
the cooler is located further from the bottom portion than an upper end of the opening in a second direction orthogonal to the first direction in the storage space, the upper end of the opening being a furthest portion in the opening from the bottom portion in the second direction,
at least a part of the terminal block is located closer to the opening than the cooler in the first direction, and is located between the upper end of the opening and the cooler in the second direction,
the terminal block has an inclined facing surface that faces the cooler and is located between the upper end of the opening and the cooler,
the inclined facing surface has a first end adjacent to the upper end of the opening and a second end further from the upper end of the opening than the first end in the second direction, and
the inclined facing surface is inclined so that the second end is closer to the opening than the first end in the first direction.

2. The power conversion device according to claim 1, wherein
the cooler includes a plurality of refrigerant pipes and a plurality of relay pipes connecting between the plurality of refrigerant pipes,
the terminal block has a projecting portion projecting in a direction opposite to the bottom portion in the second direction, and
the projecting portion faces a connection portion between at least one of the refrigerant pipes and at least one of the relay pipes in the first direction.

3. The power conversion device according to claim 2, wherein
an end of the projecting portion opposite from the bottom portion in the second direction is further away from the bottom portion than a furthest portion of the connection portion from the bottom portion in the second direction.

4. The power conversion device according to claim 1, wherein
the opening has a lower end opposite to the upper end in the second direction, and
the lower end is a furthest portion from the upper end in the opening in the second direction, and
the lower end of the opening is separated from the bottom portion in the second direction.

* * * * *